United States Patent
Glovatsky et al.

[11] Patent Number: 5,938,455
[45] Date of Patent: *Aug. 17, 1999

[54] THREE-DIMENSIONAL MOLDED CIRCUIT BOARD HAVING INTERLOCKING CONNECTIONS

[75] Inventors: Andrew Zachary Glovatsky, Ypsilanti; Michael George Todd, South Lyon; Peter Joseph Sinkunas, Canton; Myron Lemecha, Dearborn, all of Mich.

[73] Assignee: Ford Motor Company, Dearborn, Mich.

[ * ] Notice: This patent issued on a continued prosecution application filed under 37 CFR 1.53(d), and is subject to the twenty year patent term provisions of 35 U.S.C. 154(a)(2).

[21] Appl. No.: 08/649,735

[22] Filed: May 15, 1996

[51] Int. Cl.$^6$ ........................................... H01R 9/09
[52] U.S. Cl. ............................................. 439/74; 439/290
[58] Field of Search ..................... 439/74, 75, 85, 439/931, 69, 284, 290

[56] References Cited

U.S. PATENT DOCUMENTS

| | | | |
|---|---|---|---|
| 2,892,129 | 6/1959 | Henry, Jr. | 439/74 |
| 2,938,068 | 5/1960 | Silverschotz | 439/74 |
| 3,329,851 | 7/1967 | Bvaeutigam et al. | 439/825 |
| 3,465,435 | 9/1969 | Steranko | 29/628 |
| 3,526,867 | 9/1970 | Keeler, II | 439/74 |
| 3,594,493 | 7/1971 | Edgeware | 439/74 |
| 4,411,633 | 10/1983 | Waldron | 445/24 |
| 4,525,247 | 6/1985 | McMonagle | 439/85 |
| 4,591,220 | 5/1986 | Impey | 439/85 |
| 4,813,129 | 3/1989 | Karnezos | 29/832 |
| 4,931,021 | 6/1990 | Mohan | 439/285 |
| 4,940,181 | 7/1990 | Juskey, Jr. et al. | 228/180.2 |
| 4,988,306 | 1/1991 | Hopfer, III et al. | 439/74 |
| 5,071,363 | 12/1991 | Reylek et al. | 439/291 |
| 5,121,299 | 6/1992 | Frankeny et al. | 361/413 |
| 5,127,838 | 7/1992 | Zaderej et al. | 439/74 |
| 5,156,552 | 10/1992 | Zaderej et al. | 439/59 |
| 5,158,465 | 10/1992 | Zaderej et al. | 439/55 |
| 5,219,292 | 6/1993 | Dickirson et al. | 439/67 |
| 5,244,395 | 9/1993 | DeSantis et al. | 439/65 |
| 5,292,265 | 3/1994 | Chen et al. | 439/876 |
| 5,342,207 | 8/1994 | Sobhani | 439/74 |
| 5,364,277 | 11/1994 | Crumly et al. | 439/67 |
| 5,397,239 | 3/1995 | Zaderej et al. | 439/55 |
| 5,415,555 | 5/1995 | Sobhani | 439/74 |
| 5,415,573 | 5/1995 | Chen et al. | 439/876 |
| 5,461,202 | 10/1995 | Sera et al. | 174/254 |

Primary Examiner—Paula Bradley
Assistant Examiner—Tho Dac Ta
Attorney, Agent, or Firm—Leslie C. Hodges; Roger L. May

[57] ABSTRACT

A circuit board assembly is disclosed comprising a pair of three-dimensional substrates having integral, metallized connectors. The connector of the first substrate protrudes therefrom, while the connector of the second substrate is recessed therein. The geometries of the protruding connector and the recessed connector are different such that they deform when assembled to provide an electrical connection and a detachable physical connection. In one embodiment, the recessed connector has a parabolic cross-section and the protruding connector has a circular cross-section. A flexible molded edge connector for the circuit board assembly is also disclosed.

21 Claims, 8 Drawing Sheets

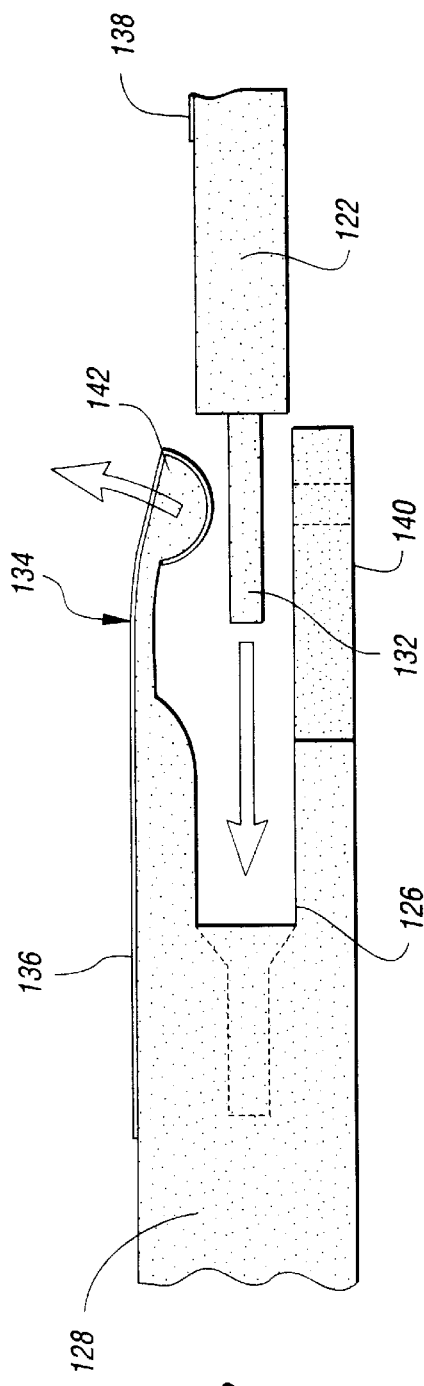
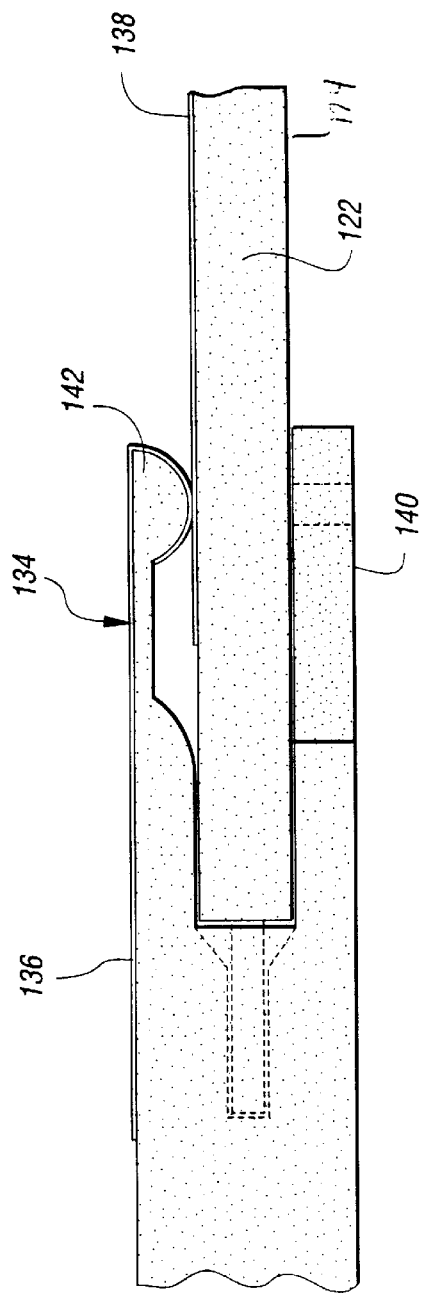

THREE-DIMENSIONAL MOLDED CIRCUIT BOARD HAVING INTERLOCKING CONNECTIONS

TECHNICAL FIELD

This invention relates to molded circuit boards and, more particularly, to a three-dimensional molded circuit board having interlocking mechanical and electrical connections.

BACKGROUND ART

Conventional planar printed wiring boards (PWBs) have been replaced by three-dimensional molded circuit boards in many applications, such as in cellular telephones, pagers and computers. The three-dimensional circuit boards act as a substrate for the metallized circuitry, plated through-holes and electronic components which are subsequently mounted onto the circuitry.

These molded boards typically have two exterior surfaces which are metallized and interconnected with a plated through-hole or other interconnection scheme. In many applications, two or more molded circuit boards must be electrically and physically connected. Separate connectors for joining the two circuit boards are typically soldered onto the board circuitry.

SUMMARY OF THE INVENTION

The present invention is a circuit board assembly comprising a pair of three-dimensional substrates having integral, metallized connectors. The connector of the first substrate protrudes therefrom, while the connector of the second substrate is recessed therein. The geometries of the protruding connector and the recessed connector are different such that they deform when assembled to provide an electrical connection and a detachable physical connection. A flexible molded edge connector for the circuit board assembly is also described.

Accordingly, it is an object of the present invention to provide a circuit board assembly of the type described above having a self-aligning press fit interlocking connector molded into the surface the substrate which allows for mechanical alignment, interlocking and electrical interconnection between the substrates.

Another object of the present invention is to provide a circuit board assembly of the type described above in which the molded-in metallized features of the substrates allow for direct board to board mechanical and electrical interconnection without the need to attach separate male-female or edge connectors to the circuit boards.

Another object of the present invention is to provide a flexible edge connector for the circuit board assembly which provides mechanical alignment and electrical interconnect between two mating three-dimensional circuit board parts without the need for stand-alone connectors.

Another object of the present invention to provide a three-dimensional circuit board which does not require soldering or physically distinct electrical connectors to electrically join to another circuit boards.

These and other objects, features, and advantages of the present invention are readily apparent from the following detailed description of the best mode for carrying out the invention when taken in conjunction with the accompanying drawings.

BRIEF DESCRIPTION OF THE DRAWINGS

FIG. 13 is a cross-sectional view of the unassembled edge connector;

FIG. 14 is a cross-sectional view of the assembled edge connector;

BEST MODE FOR CARRYING OUT THE INVENTION

Figure 1:
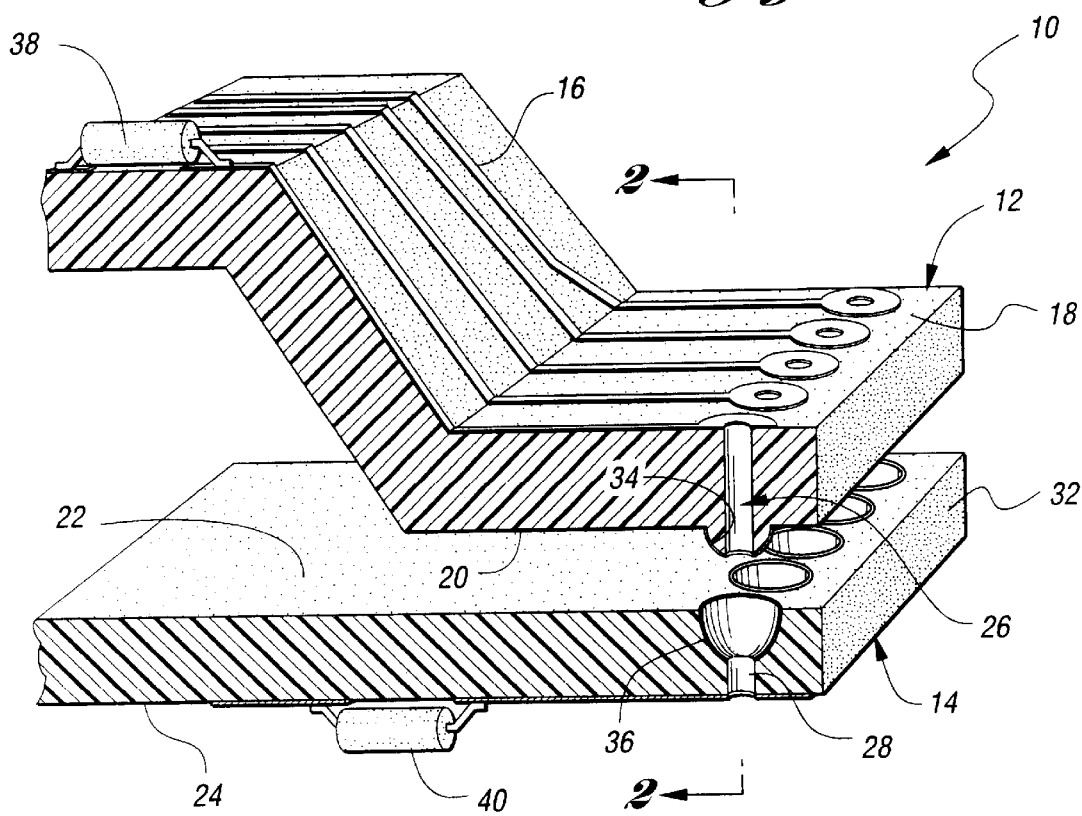
FIG. 1 is a perspective view of a circuit board assembly according to the present invention.
Figure 2:
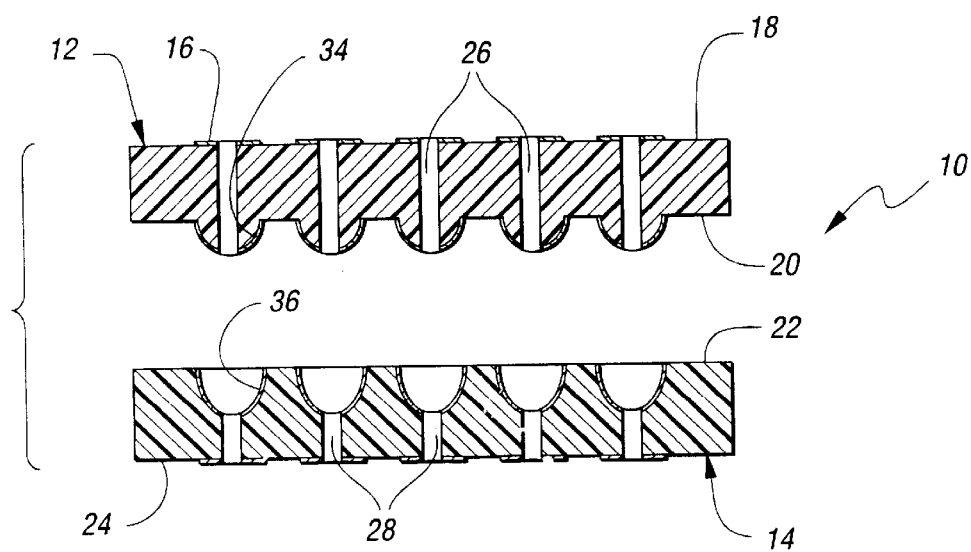
FIG. 2 is a cross-sectional view taken along line 2—2 in FIG. 1.

With reference to the drawings, the preferred embodiments of the present invention will be described. FIGS. 1 and 2 show a circuit board assembly 10 according to the present invention. The circuit board assembly 10 comprises a first three-dimensional substrate 12 and a second three-dimensional substrate 14. The substrates 12 and 14 are both preferably injection molded or otherwise formed from a substantially non-conductive polymeric material such as polyetherimide (PEI), acrylonitrile-butadiene-styrene (ABS) or polypropylene (PP).

The substrates 12 and 14 are metallized via photo-imaging and a plating process such as electroless or electrolytic plating to generate circuit lines 16 on one or more of their major exterior surfaces 18, 20, 22 and 24. Plated through-holes 26 connect the circuitry 16 on surface 18 to surface 20 of the substrate 12, and likewise surface 22 is connected to surface 24 with plated through-holes 28.

Figure 3:
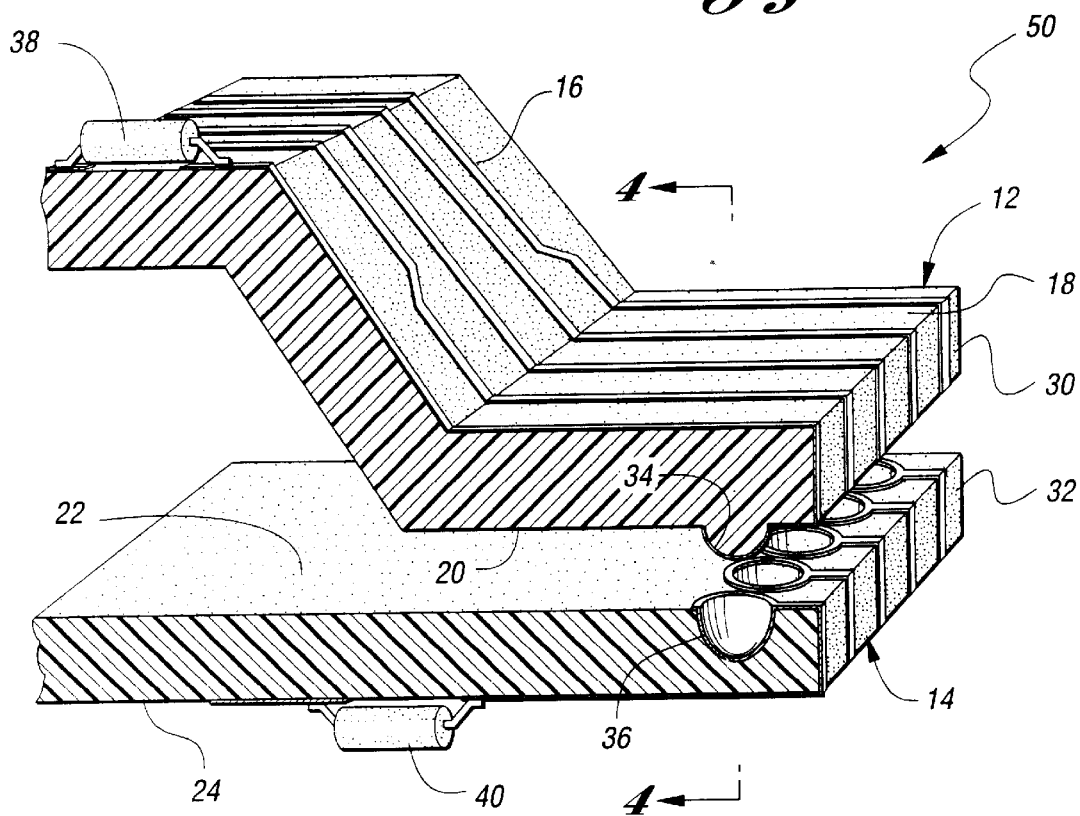
FIG. 3 is a perspective view of an alternative embodiment of the circuit board assembly.
Figure 4:
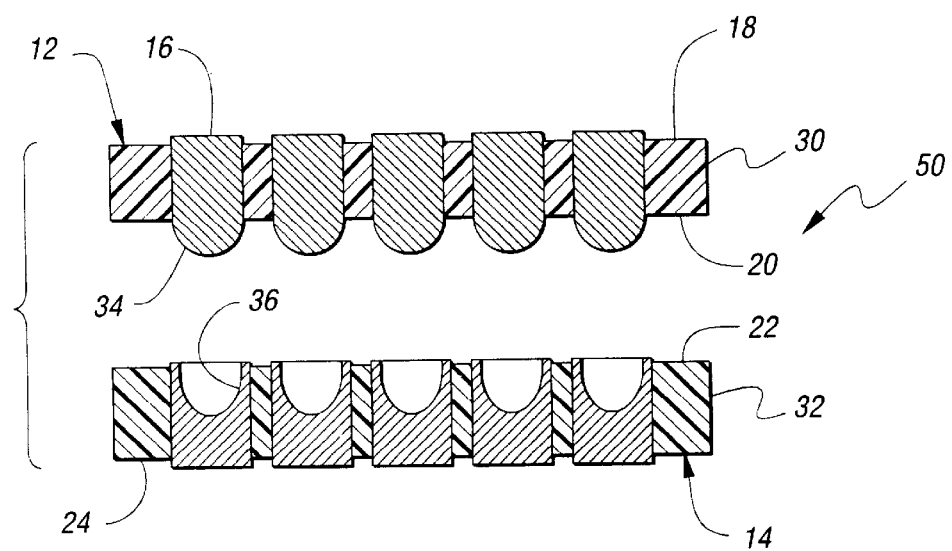
FIG. 4 is a cross-sectional view taken along line 4—4 in FIG. 3.

FIGS. 3 and 4 show an alternative embodiment 50 of the circuit board assembly in which circuitry patterns on the upper and lower surfaces of substrate 12 are interconnected by running surface circuit lines 16 over an edge 30 to the bottom surface 20 of the substrate 12. The surface 22 of substrate 14 is similarly connected to surface 24 over edge surface 32.

In both embodiments 10 and 50, protruding connectors 34 and recessed connectors 36 are integrally molded with their respective substrates, and then metallized. The connectors 34 and 36 have different geometries such that they deform when assembled to provide self-aligning and detachable electrical and physical press fit connections between the substrates 12 and 14.

The shapes of the mating connectors 34 and 36 can be varied to provide different contact geometries and surface contact areas. Preferably, these shapes are such that as the protruding connectors 34 slide into the recessed connectors 36, their facing surfaces abrade and the surfaces of the recessed connectors 36 are forced apart by the surfaces of the protruding connectors 34. To accomplish this, the maximum dimension of each protruding connector 34 parallel to the surface 20 is preferably slightly larger than the minimum dimension of the entrance of its opposite recessed connector 36.

The rubbing or wiping motion removes oxides from the surfaces to insure a good electrical contact. During insertion, plastic deformation of the protruding connectors 34 and the recessed connectors 36 is controlled by the dimensions of the connectors 34 and 36. The deformation of each recessed connector 36 acts to push against its mating protruding connector 34 to hold it in place. In FIGS. 1–4, for example, the protruding connectors 34 have a circular cross-section while the recessed connector 36 has a slightly smaller parabolic cross-section.

When the substrates 12 and 14 are mated, the circuitry on surface 18 is connected to the circuitry on surface 24, allowing electronic components 38 and 40 to communicate through the interconnection region. The facing surfaces 20 and 22 may also include circuit lines and electronic components, if desired.

Figure 5:
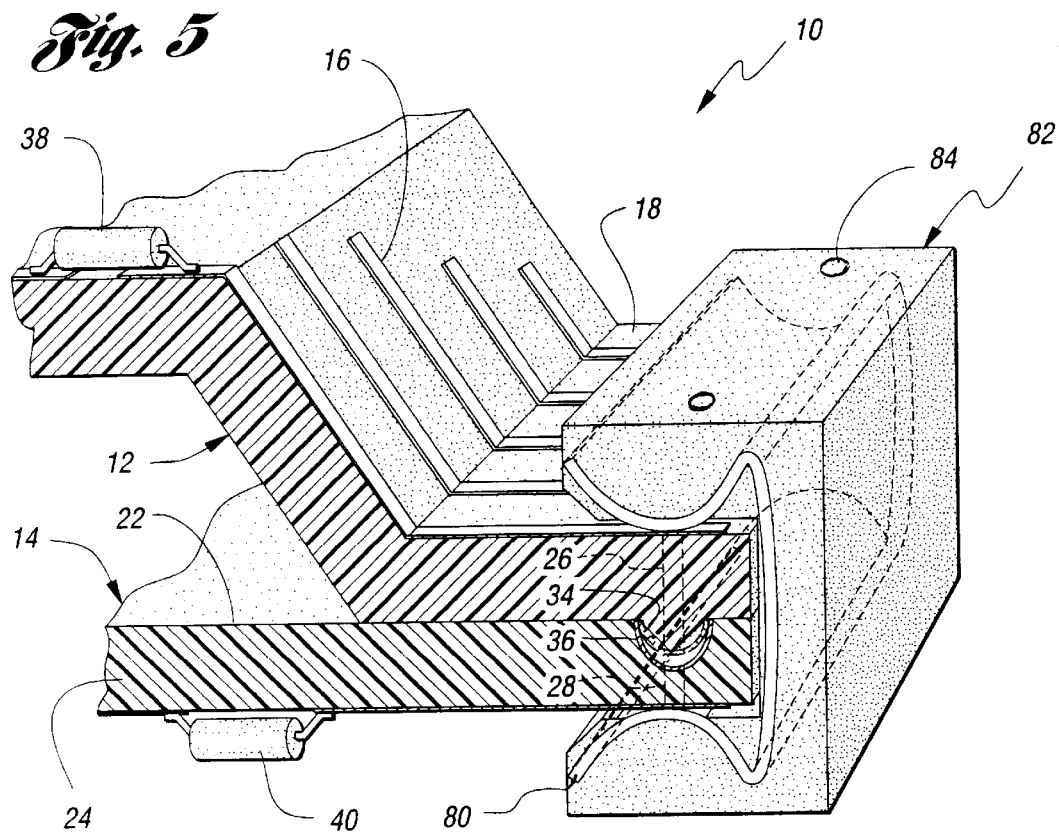
FIG. 5 is a perspective view of another alternative embodiment of the circuit board assembly.
Figure 6:
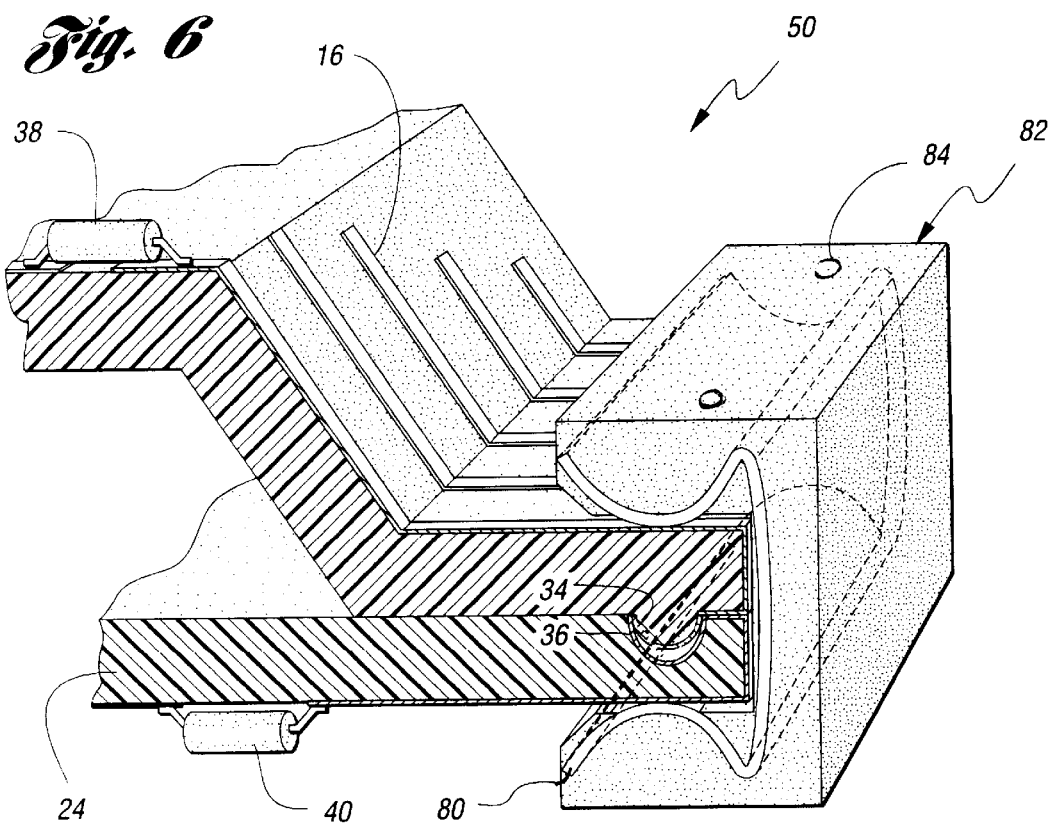
FIG. 6 is a perspective view of a third alternative embodiment of the circuit board assembly.

Once the substrates 12 and 14 are brought together, a compressive force may be applied to ensure electrical contact is maintained between the metallized surfaces of connectors 34 and 36, and to inhibit any separation tendencies due to vibration. FIGS. 5 and 6 show a spring clip 80 housed in a clip body 82 disposed over the edge of the joined substrates 12 and 14 for applying a force uniformly along and over the length of the interconnection points. The clip 80 may be composed of plastic or metal depending upon the compression force required for the application. The clip 80 is secured through screw hole locations 84 on both ends of the clip or at points along the clip. The outer surface of spring clip 80 is insulated to prevent short circuits between the different circuit lines. Other clip connector designs may be used, or a bar may be mechanically anchored across the interconnection region on both sides of the joined boards.

Figure 7:
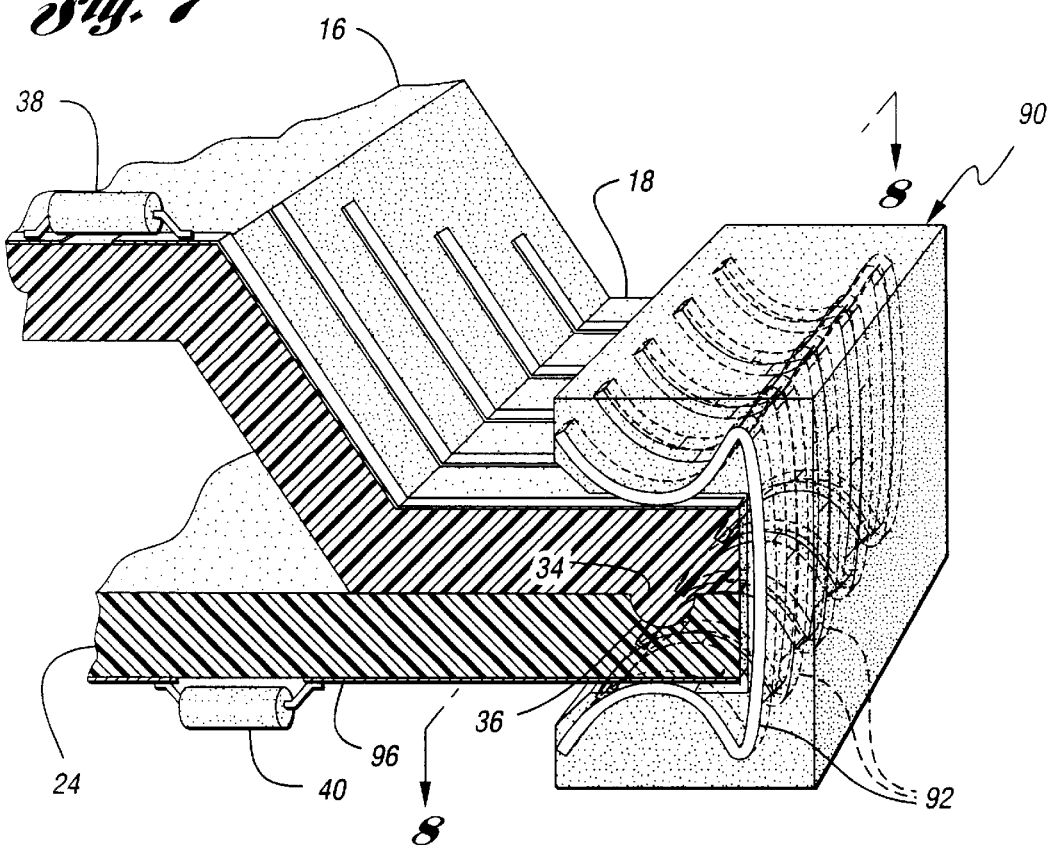
FIG. 7 is a perspective view of a fourth alternative embodiment of the circuit board assembly.
Figure 8:
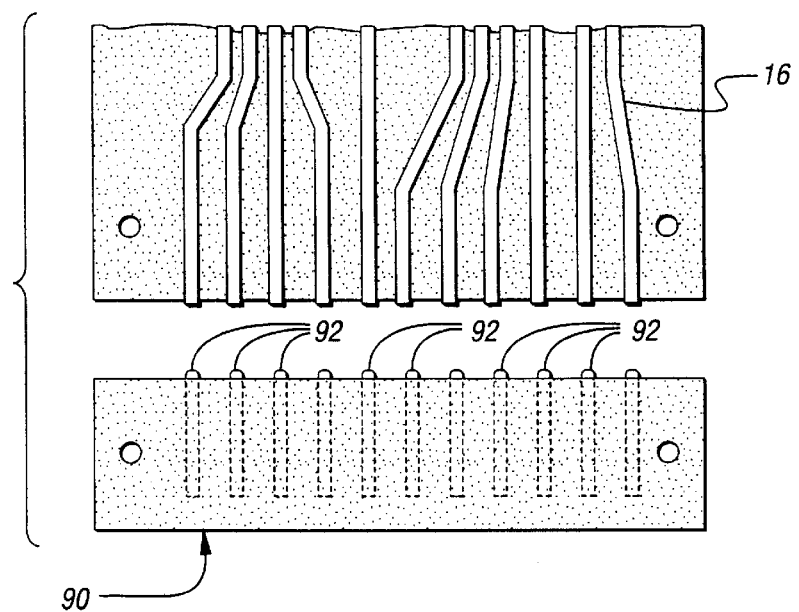
FIG. 8 is a top view of the circuit board assembly of FIG. 7.

FIGS. 7 and 8 show an alternative conductive jumper clip 90 having individual metal edge spring connectors 92 to interconnect lines 16 on surface 18 to lines 94 on surface 24. In this arrangement, the connectors 34 and 36 act only as mechanical interlocking and alignment features, and not for electrical interconnection between the two substrates 12 and 14.

Figure 9:
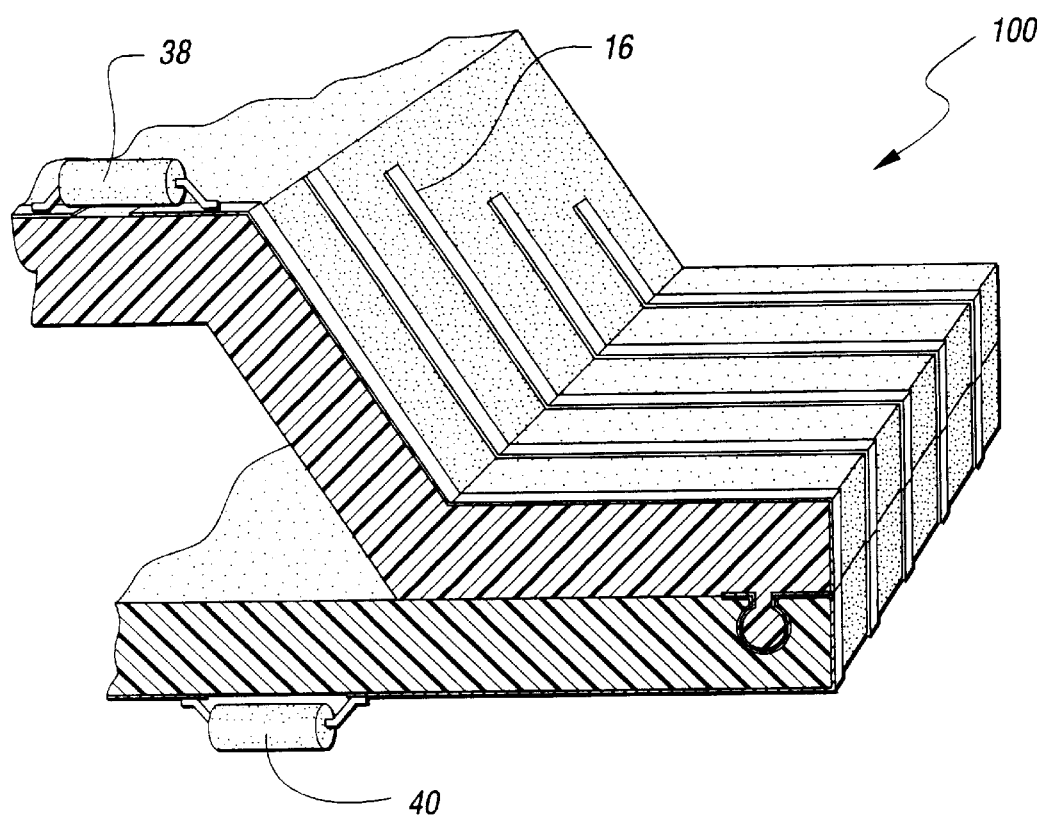
FIG. 9 is a perspective view of a fifth alternative embodiment of the circuit board assembly.
Figure 10:
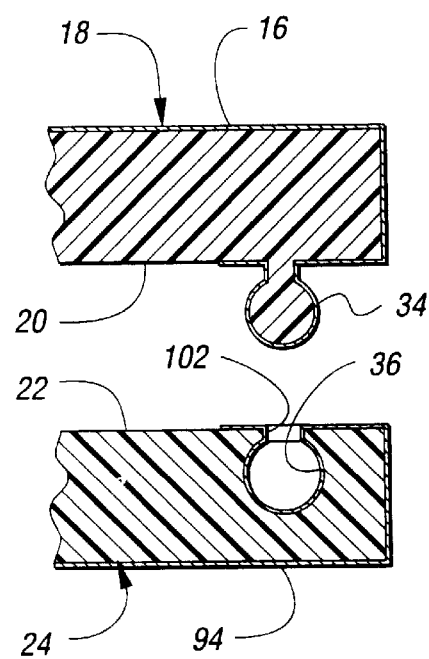
FIG. 10 is an enlarged side view of the circuit board assembly of FIG. 9.

FIGS. 9 and 10 show a snap-fit interlocking interconnection design 100 in which the connectors 34 and 36 snap together. The physical dimensions of the connectors are such that a mechanical and electrical interlock is achieved upon pressing the connector 34 into connector 36. This design allows for the metal surfaces to abrade each other to remove oxides and facilitate electrical interconnection about the surface opening of the connector 36. The use of different plastics substrate materials will facilitate repeated uses of the interconnection for repair or replacement activity. For example, the protruding connector 34 has a slightly larger radius than the opening of recessed connector 36, and may comprise a higher durometer plastic than the connector 36. The softer material used in substrate 14 is thus more elastic so that repeated uses are feasible without destroying a lip 102 of the recessed connector 36. Alternatively, the recessed connector may comprise a material having a higher durometer than a material comprising the protruding connector. The adhesion of plated plastics is sufficient to allow the metallization to bend in response to this mechanical deformation of the lip 102.

Thus, the present invention allows the substrate to substrate interconnection to be opened repeatedly without damage, so that repair or replacement of a substrate can be done quickly. It should be appreciated that the connectors 34 and 36 can be configured in various patterns such as multiple rows, staggered rows, array patterns or other arrangement required for the application.

It should also be appreciated that rather than the vertical orientation shown in FIGS. 1–4, the substrates can be connected in a linear or end-to-end fashion by locating the connectors 34 and 36 on the minor end surfaces 30 and 32. This design is useful for creating a long bus structure connecting two or more molded substrates.

Figure 11:
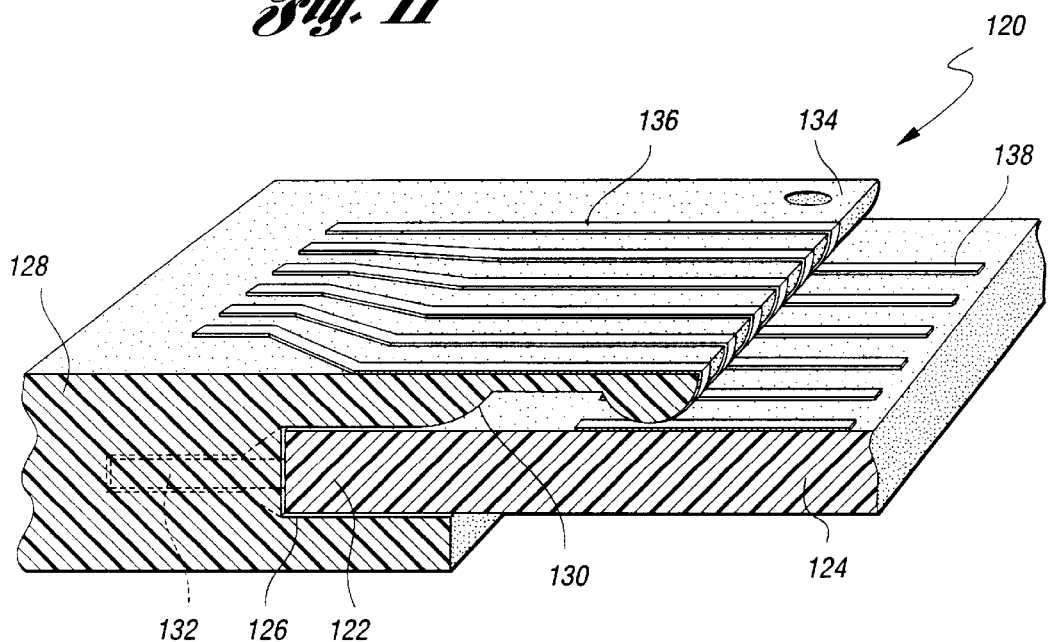
FIG. 11 is a perspective view, partially in cross-section, of a molded flexible edge connector.
Figure 12:
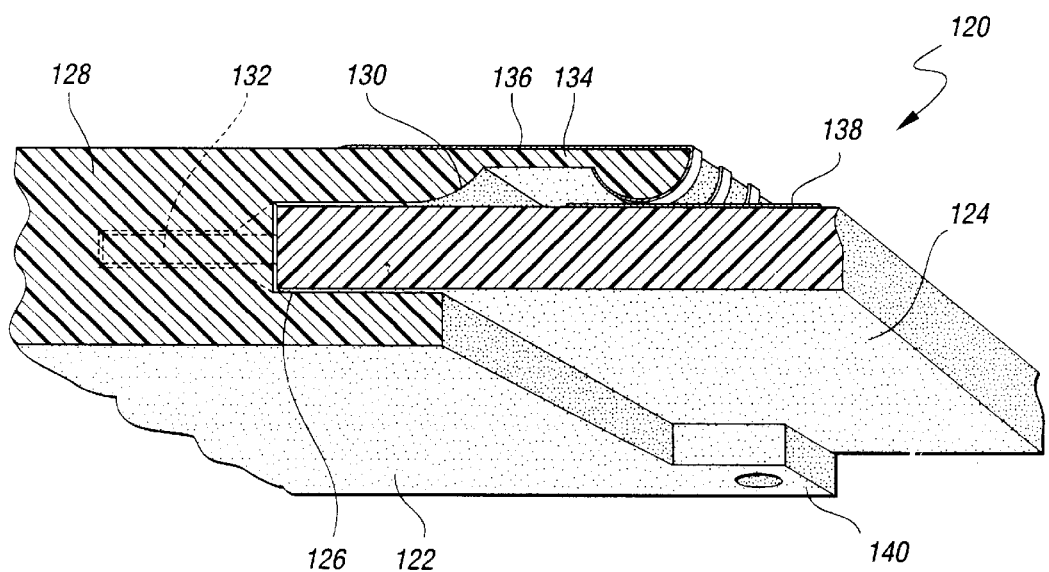
FIG. 12 is another perspective view, partially in cross-section, of the molded flexible edge connector of FIG. 11.

Another method of linear mechanical and electrical attachment of substrates is shown in FIGS. 11 and 12. A flexible edge connector assembly 120 includes a male extension 122 of a three-dimensional circuit board 124 and a female groove 126 integrally injection molded with a three-dimensional circuit board 128. Rounded surface 130 serves as a guide to direct the board 124 into the groove 126 to allow any alignment pins 132 to properly align the boards.

The electrical interconnection is achieved by edge connector 134 which protrudes from the main body of the board 128 and brings electrical circuit lines 136 into contact with aligned electrical circuit lines 138 on the board 124. The lines 136 and 138 are preferably comprised of copper with either a solder plating, organic antioxidant or noble metal coating such as gold. A mounting location 140 is also provided for additional and/or final attachment between the boards 124 and 128.

FIGS. 13 and 14 show one assembly process for the boards 124 and 128. As shown in FIG. 13, the edge connector 134 may be molded with a head 142 in a position bent inward toward groove 126. The circuit lines 136 run around the edge connector 134 to make electrical contact with the lines 138. As the board 124 is inserted into the groove 126, the edge connector 134 is forced to flex back and into contact with the circuit lines 138 on the surface of board 124. Due to its pre-stressed state, the edge connector 134 maintains contact with board 124 and circuit lines 138 as shown in FIG. 14.

The flexible edge connector 134 is usable on low temperature substrate materials such as PP and ABS, which typically cannot undergo conventional reflow or other solder processing. During the insertion of board 124, the edge connector 134 rides along the surface of board 128 and creates sufficient force between the circuit lines so that oxides and contaminates are wiped away from the mating surfaces of the coated copper lines. The electrical contact between the circuit lines is achieved through physical asperitic contact of the interfacial surfaces of the edge connector on board 128 and the circuit lines 138 of board 124. This design allows for the connector to be used repeatedly. This invention also allows the connector to withstand and function even with severe thermal expansion mismatches between the boards. The bendable edge connector 134 on board 128 flexes freely while maintaining pressure against board 124 and electrical contact between the boards during temperature excursions which may cause the boards to dimensionally change. The ability of the edge connector 134 to flex in response to dimensional changes in the boards avoids issues of intermittent and electrical opens. The connector 134 can be designed with a strain relief feature to absorb additional dimensional strain from thermal expansion differences between the substrates. This feature is beneficial if the connector is soldered.

Figure 15:
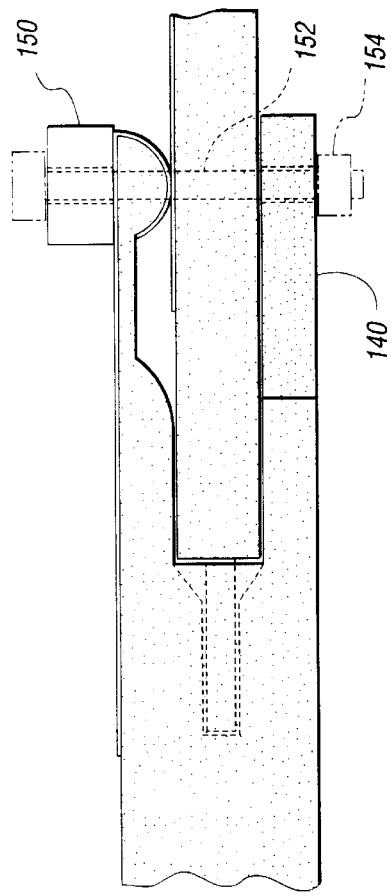
FIG. 15 is a cross-sectional view of an alternative embodiment of the edge connector.

If additional compressive force is required on the edge connector to insure the electrical contact, a metal flat or spring loaded bar 150 can be applied through the bar support mounting locations 140 using pins 152 with fasteners 154 as shown in FIG. 15.

Figure 16:
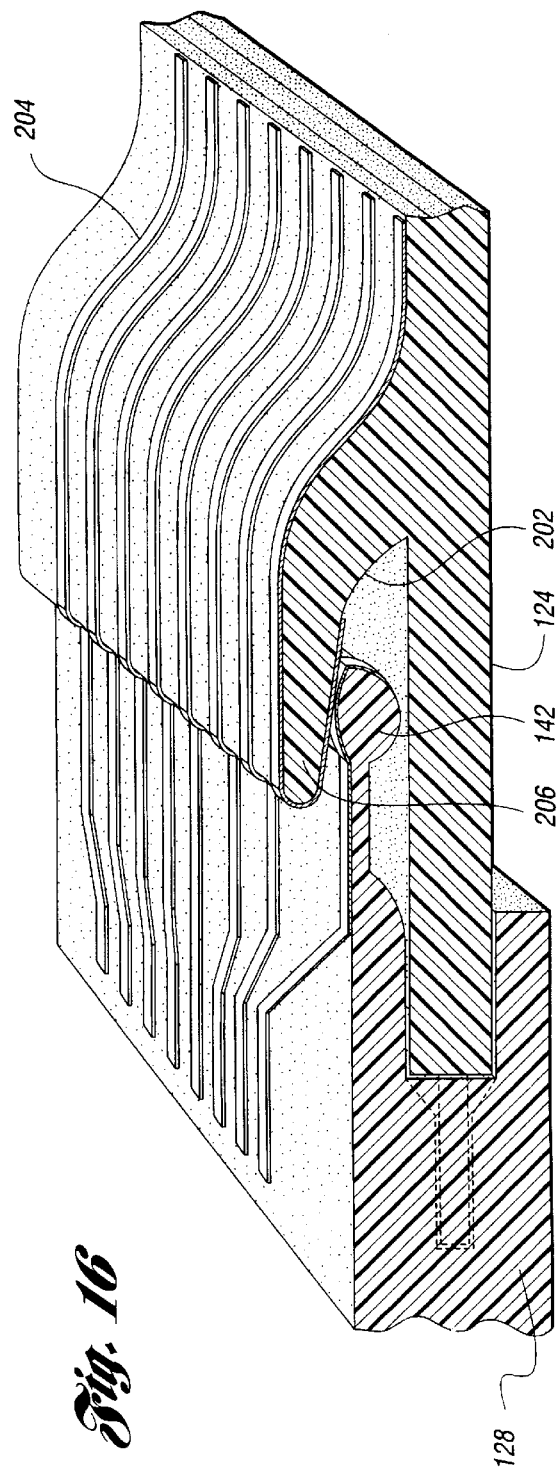
FIG. 16 is a perspective view of another alternative embodiment of the edge connector.

Another alternative embodiment 200 is shown in FIG. 16 which improves electrical interconnection so that a compressive support bar is not required. The board 124 has a receiving groove 202 with plated lines 204 which wrap around a receiving projection 206. The head 142 of the edge connector of board 128 interlocks with groove 202 and ensures that a sufficient compressive wiping force is generated between the circuit lines on these features.

When formed with high temperature engineering plastics such as LCP or PEI (Ultem), the connectors can withstand conventional epoxy-based circuit board solder processing. These plastic boards can be soldered together to achieve a soldered interconnect using typical eutectic solders. The coefficient of thermal expansion (CTE) for these plastic materials is more compatible with eutectic tin-lead alloy solders. Furthermore, lower temperature solders can be used with the lower temperature engineering thermoplastics to create soldered interconnections. The lower temperature plastics have large CTEs so highly ductile solders such as tin-indium can be used to increase joint reliability.

It should be understood that while the forms of the invention herein shown and described constitute preferred embodiments of the invention, they are not intended to illustrate all possible forms thereof. It should also be understood that the words used are words of description rather than limitation, and various changes may be made without departing from the spirit and scope of the invention disclosed.

What is claimed is:

1. A circuit board assembly comprising:
a first, a non-planar substrate having an upper surface and a lower surface, the first non-planar substrate including circuitry disposed on the upper surface and a plurality of protruding connectors having a first geometry integrally molded on the lower surface, the plurality of protruding connectors being metallized about the first geometry, wherein a metallized through hole is provided in each of the plurality of protruding connectors extending between the upper surface and the lower surface of the non-planar substrate, the metallized through hole connecting the circuitry on the upper surface with the metallized protruding connector on the lower surface; and
a second substrate having an upper surface and a lower surface, the second substrate including a plurality of recessed connectors having a second geometry integrally molded on the upper surface and circuitry disposed on the lower surface, the plurality of recessed connectors being metallized about the second geometry, wherein a metallized through hole is provided in each of the plurality of recessed connectors extending between the upper surface and the lower surface of the second substrate, the metallized through hole of the second substrate connecting the metallized protruding connector on the upper surface of the second substrate with the circuitry on the lower surface, wherein the metallized through hole in each of the plurality of recessed connectors aligns with the metallized through hole in each of the corresponding plurality of protruding connectors;
the geometries of the plurality of protruding connectors and the plurality of recessed connectors being different such that they deform when assembled to provide an electrical connection and a detachable physical connection.

2. The circuit board assembly of claim 1 wherein the protruding connector and the recessed connector are adapted to form a snap fit.

3. The circuit board assembly of claim 1 wherein the first substrate is non-conductive.

4. The circuit board assembly of claim 1 wherein the first substrate comprises plastic.

5. The circuit board assembly of claim 1 wherein the protruding connector comprises a material having a higher durometer than a material comprising the recessed connector.

6. The circuit board assembly of claim 1 wherein the recessed connector comprises a material having a higher durometer than a material comprising the protruding connector.

7. The circuit board assembly of claim 1 wherein the protruding connector is formed on a lower surface of the first substrate and the recessed connector is formed on an upper surface of the second substrate.

8. The circuit board assembly of claim 1 further comprising a first electrical line formed on the first substrate and communicating with the protruding connector.

9. The circuit board assembly of claim 1 wherein the recessed connector has an entrance with a minimum dimension.

10. The circuit board assembly of claim 9 wherein the protruding connector has a maximum dimension greater than the minimum dimension of the recessed connector.

11. The circuit board assembly of claim 1 wherein the recessed connector has a parabolic cross-section.

12. The circuit board assembly of claim 11 wherein the protruding connector has a circular cross-section.

13. A circuit board assembly comprising:
a first, a non-planar substrate comprising a first material having an upper surface and a lower surface, the first non-planar substrate including circuitry disposed on the upper surface and a plurality of protruding connectors having a first geometry integrally molded on the lower surface, the plurality of protruding connectors being metallized about the first geometry, wherein a metallized through hole is provided in each of the plurality of protruding connectors extending between the upper surface and the lower surface of the non-planar substrate, the metallized through hole connecting the circuitry on the upper surface with the metallized protruding connector on the lower surface; and
a second substrate having an upper surface and a lower surface, the second substrate including a plurality of recessed connectors having a second geometry integrally molded on the upper surface and circuitry disposed on the lower surface, the plurality of recessed connectors being metallized about the second geometry, wherein a metallized through hole is provided in each of the plurality of recessed connectors extending between the upper surface and the lower surface of the second substrate, the metallized through hole of the second substrate connecting the metallized protruding connector on the upper surface of the second substrate with the circuitry on the lower surface, wherein the metallized through hole in each of the plurality of recessed connectors aligns with the metallized through hole in each of the corresponding plurality of protruding connectors;

the geometries of the plurality of protruding connectors and the plurality of recessed connectors being different such that they deform when assembled to provide an electrical connection.

14. The circuit board assembly of claim 13 wherein the recessed connector has an entrance with a minimum dimension.

15. The circuit board assembly of claim 13 wherein the protruding connector has a maximum dimension greater than the minimum dimension of the recessed connector.

16. The circuit board assembly of claim 13 wherein the first substrate is non-conductive.

17. The circuit board assembly of claim 13 wherein the first substrate comprises plastic.

18. The circuit board assembly of claim 13 wherein the protruding connector comprises a material having a higher durometer than a material comprising the recessed connector.

19. The circuit board assembly of claim 13 wherein the recessed connector comprises a material having a higher durometer than a material comprising the protruding connector.

20. The circuit board assembly of claim 13 wherein the recessed connector has a parabolic cross-section.

21. The circuit board assembly of claim 20 wherein the protruding connector has a circular cross-section.

* * * * *